(12) United States Patent
Yang et al.

(10) Patent No.: US 8,044,293 B2
(45) Date of Patent: Oct. 25, 2011

(54) HIGH PERFORMANCE THERMOELECTRIC NANOCOMPOSITE DEVICE

(75) Inventors: Jihui Yang, Lakeshore (CA); Dexter D. Snyder, Birmingham, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1252 days.

(21) Appl. No.: 11/354,685

(22) Filed: Feb. 15, 2006

(65) Prior Publication Data

US 2006/0185710 A1 Aug. 24, 2006

Related U.S. Application Data

(60) Provisional application No. 60/654,300, filed on Feb. 18, 2005.

(51) Int. Cl.
*H01L 35/14* (2006.01)
(52) U.S. Cl. ........................... 136/239; 136/238
(58) Field of Classification Search ................ None
See application file for complete search history.

(56) References Cited

U.S. PATENT DOCUMENTS

| | | | |
|---|---|---|---|
| 4,149,025 A * | 4/1979 | Niculescu | 136/206 |
| 6,159,831 A | 12/2000 | Thrush et al. | |
| 6,342,668 B1 | 1/2002 | Fleurial et al. | |
| 6,670,539 B2 | 12/2003 | Heremans et al. | |
| 2002/0083972 A1 * | 7/2002 | Prasher | 136/201 |
| 2002/0170590 A1 * | 11/2002 | Heremans et al. | 136/240 |
| 2004/0112418 A1 | 6/2004 | Yang et al. | |
| 2006/0032526 A1 * | 2/2006 | Fukutani et al. | 136/205 |

FOREIGN PATENT DOCUMENTS

JP   2005005675 A * 1/2005 ............... 136/200

OTHER PUBLICATIONS

Heremans, J. et al., Thermoelectric Power of Bismuth Nanocomposites, Physical Review Letters, vol. 88, No. 21, May 27, 2002, pp. 216801-1-216801-4.

Elmer, T., Porous and Reconstructed Glasses, Engineered Materials Handbook, vol. 4, Ceramic and Glasses, 1992, pp. 427-432.

* cited by examiner

*Primary Examiner* — Alexa Neckel
*Assistant Examiner* — Miriam Berdichevsky
(74) *Attorney, Agent, or Firm* — Dierker & Associates, P.C.

(57) ABSTRACT

A thermoelectric device includes a nanocomposite material with nanowires of at least one thermoelectric material having a predetermined figure of merit, the nanowires being formed in a porous substrate having a low thermal conductivity and having an average pore diameter ranging from about 4 nm to about 300 nm.

19 Claims, 2 Drawing Sheets

HIGH PERFORMANCE THERMOELECTRIC NANOCOMPOSITE DEVICE

CROSS-REFERENCE TO RELATED APPLICATIONS

This application claims the benefit of provisional application Ser. No. 60/654,300, filed Feb. 18, 2005.

STATEMENT REGARDING FEDERALLY SPONSORED RESEARCH OR DEVELOPMENT

This invention was made in the course of research partially supported by a grant from the Department of Energy (DOE), Grant No. DE-FC26_04NT42278. The U.S. government has certain rights in the invention.

TECHNICAL FIELD

The present disclosure relates to high-efficiency thermoelectric materials, and more particularly to a thermoelectric device utilizing such materials.

BACKGROUND

Advanced thermoelectric applications for high efficiency thermoelectric materials include solid state thermoelectric devices for converting thermal energy into electrical energy, and for cooling using electricity. Thermoelectric materials may be used in an electrical circuit between a high temperature junction and a low temperature junction. For thermoelectric power generation, a temperature difference between the junctions is utilized to generate electrical energy; while in thermoelectric cooling, electrical energy is used to transfer heat from a cold junction to a hot junction. Thermoelectric technology is of interest in many areas, including but not limited to the automotive industry, due to the potential for waste heat recovery to improve fuel economy and for environmentally friendly cooling. Significant effort has been expended to develop improved thermoelectric materials since the performance of a thermoelectric device depends, at least in part, on the thermoelectric material properties.

The energy conversion efficiency and cooling coefficient of performance (COP) of a thermoelectric (TE) device are determined by the dimensionless TE materials' figure of merit, ZT, defined as $$ZT = \frac{S^2 T}{\rho \kappa_{total}} = \frac{S^2 T}{\rho (\kappa_L + \kappa_e)},$$

where S, T, $\rho$, $\kappa_{total}$, $\kappa_L$, and $\kappa_e$ are the Seebeck coefficient, absolute temperature, electrical resistivity, total thermal conductivity, lattice thermal conductivity and electronic thermal conductivity, respectively. The larger the ZT values, the higher the efficiency or the Coefficient of Performance (COP). It is desirable that good thermoelectric materials possess a large Seebeck coefficient, a low electrical resistivity, and a low total thermal conductivity. The Seebeck coefficient (S) is a measure of how readily the respective charge carriers (electrons or holes) can transfer energy as they migrate through a thermoelectric material that is subjected to a temperature gradient. The type of charge carriers, whether electron or hole, depends on the dopants (N-type or P-type) in the semiconductor materials used to form the thermoelectric materials.

In an effort to increase ZT, many material exploration and optimization investigations have been undertaken to lower the lattice thermal conductivity ($\kappa_L$) without deteriorating the power factor ($S^2/\rho$). For example, in thermoelectric materials such as skutterudites, clathrates and chalcogenides, all of which have a microscopic cage-like structure, guest ions interstitially inserted into the voids of the crystal lattice of the materials exhibit large atomic displacement parameters. These guest ions, termed "rattlers", interact with low-frequency lattice phonons. This interaction significantly reduces $\kappa_L$, leading to substantial ZT increases at both low and high temperatures. Other methods of enhancing ZT have included the introduction of simultaneous isoelectronic alloying and doping on different crystallographic sites (in the case of half-Heusler structures).

It has been recently demonstrated that a large enhancement of the Seebeck coefficient may be achieved in nanowires. Nanowires alone, however, are unlikely to be used for practical TE devices.

It would be desirable to provide a thermoelectric device utilizing a composite material having an overall low thermal conductivity, in addition to the TE material incorporated therein having a desirably high thermoelectric figure of merit (ZT). It would further be desirable to provide such a device which is suitable for use in a wide range of applications, from low temperature applications to high temperature applications.

SUMMARY

A thermoelectric device includes a nanocomposite material with nanowires of at least one thermoelectric material having a predetermined figure of merit, the nanowires being formed in a porous substrate having a low thermal conductivity and having an average pore diameter ranging between about 4 nm and about 300 nm.

BRIEF DESCRIPTION OF THE DRAWINGS

Features and advantages will become apparent by reference to the following detailed description and drawings, in which like reference numerals correspond to similar, though not necessarily identical components. For the sake of brevity, reference numerals having a previously described function may not necessarily be described in connection with other drawings in which they appear.

DESCRIPTION OF THE EMBODIMENTS

A practical, highly efficient thermoelectric (TE) device may be formed utilizing composite materials having an overall low thermal conductivity, in addition to the TE materials (incorporated in the composite material) having desirably high thermoelectric figures of merit (ZT). A practical example of such novel composite materials is formed through use of the superior properties of thermoelectric nanowires by embedding the nanowires into templates that have the mechanical strength and desirable pore size for achieving improved thermoelectric properties of the nanowire materials. Previous attempts at forming nanocomposite TE materials used materials unsuitable for high temperature applications, or resulted in nanocomposites having an undesirably high overall thermal conductivity, with low ZT materials.

The Seebeck effect (mentioned hereinabove) may be observed when two dissimilar materials are electrically connected to form a circuit with two junctions, maintained at different temperatures. In this arrangement, the temperature differential results in usable electrical potential, i.e., a voltage. The dissimilar materials may include an n-type and a p-type semiconductor material to make a thermoelectric generator. Recent studies have shown certain skutterudite materials to be highly efficient n-type and p-type materials for relatively high temperature thermoelectric applications. ZrNiSn-based half-Heusler alloys have shown promise as suitable n-type thermoelectric materials for high temperature applications. The ZrNiSn-based alloys and the skutterudites are candidates for use within thermoelectric generators for automotive waste heat recovery, since both classes of materials generally have optimum operation temperatures in substantially the same range as exhaust gases. In an embodiment, the temperature range of interest herein is from about 300 K to about 900 K.

Figure 1:
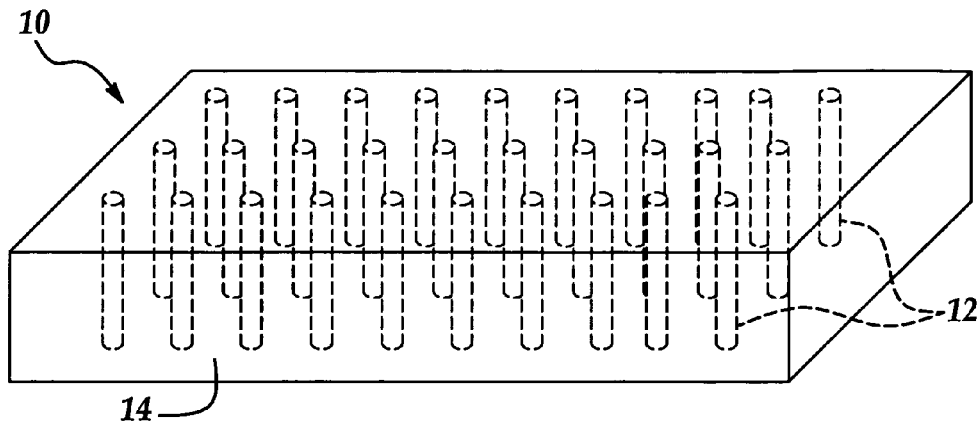
FIG. 1 is an enlarged, semi-schematic perspective view of an embodiment of nanowires within a controlled pore glass.

Referring now to FIG. 1, a thermoelectric nanocomposite material according to the present disclosure is designated generally at 10. The TE nanocomposite material 10 includes nanowires 12 formed from suitable, highly efficient TE materials (described further hereinbelow) having a predetermined figure of merit ZT, which figure of merit ZT is as high as possible. In an embodiment, the ZT is greater than about 1. Nanowires 12 are formed by any suitable method in a porous substrate 14 having a low thermal conductivity. Non-limitative examples of suitable methods for forming nanowires 12 in substrate 14 include vapor deposition, electrochemical deposition, and/or the like, and/or combinations thereof.

Further, it is to be understood that the substrate 14 should have as low a thermal conductivity as possible. In an embodiment, the thermal conductivity of the substrate 14 is equal to or less than about 2 W/m-K at room temperature. Among other factors (non-limitative examples of which include excellent thermal shock resistance and a small thermal expansion coefficient (e.g., less than about $1 \cdot 10^{-6}/° C.$), the low thermal conductivity of the porous substrate 14 renders it a desirable substrate 14 in which to form the nanowires 12.

It is to be understood that substrate 14 may be formed from any nanoporous glass material. In an embodiment, porous substrate 14 is a controlled pore glass (CPG) substrate having an average pore diameter ranging from about 4 nm to about 300 nm, with a relatively narrow distribution around the mean. In a further embodiment, the average pore diameter ranges from about 15 nm to about 200 nm. In yet a further embodiment, the average pore diameter ranges from about 25 nm to about 150 nm. In still a further embodiment, the average pore diameter is greater than about 15 nm.

One non-limitative example of a CPG is commercially available from Corning in Corning, New York under the brandname Porous VYCOR glass. Due at least in part to its low thermal conductivity (~1.38 W/m-K at room temperature), the VYCOR porous glass is one example of a desirable substrate in which to form the nanocomposite material(s) 10.

The overall thermal conductivity of the nanocomposite material 10 illustrated in FIG. 1 may generally be commensurate with that of the porous substrate 14. Thus, if the thermal conductivity of substrate 14 is about 1.38 W/m-K at room temperature, then the overall thermal conductivity of the nanocomposite material 10 is generally close to about 1.38 W/m-K at room temperature. This overall thermal conductivity is desirably comparable to the total thermal conductivity ($\kappa_{total}$) of highly efficient TE materials.

It is to be understood that the thermoelectric materials suitable for use as nanowires 12 may be any suitable, highly efficient TE materials having desirable melting points, including but not limited to at least one of $Zn_4Sb_3$, PbTe-based alloys, filled skutterudites (including but not limited to n-type Ce-filled skutterudites, n-type Ba-filled skutterudites, n-type Yb-filled skutterudites, and combinations thereof), SiGe alloys, ZrNiSn-based half-Heusler alloys, clathrates, and mixtures thereof. In an embodiment, the TE materials for forming the nanowires 12 include, but are not limited to at least one of filled skutterudites, PbTe-based alloys, $Zn_4Sb_3$-based alloys, and mixtures thereof.

The porous substrate 14 advantageously exhibits excellent thermal shock resistance and a small thermal expansion coefficient, as well as a high melting point (e.g., greater than about 1000 K). This renders the porous substrate 14 desirable for practical usage within a thermoelectric device. The glass templates are insulators; therefore, the electronic transport is generally dominated by the conducting thermoelectric nanowires 12. The nanocomposite material(s) 10 described herein have low thermal conductivity, as well as enhanced electronic properties ($S^2/\rho$) due, at least in part, to the nanowires 12. As such, without being bound to any theory, it is believed that the nanocomposite material(s) 10 exhibit more enhanced TE properties than those of previously known TE materials: BiSb, $Bi_2Te_3$, PbTe, and SiGe.

Figure 2:
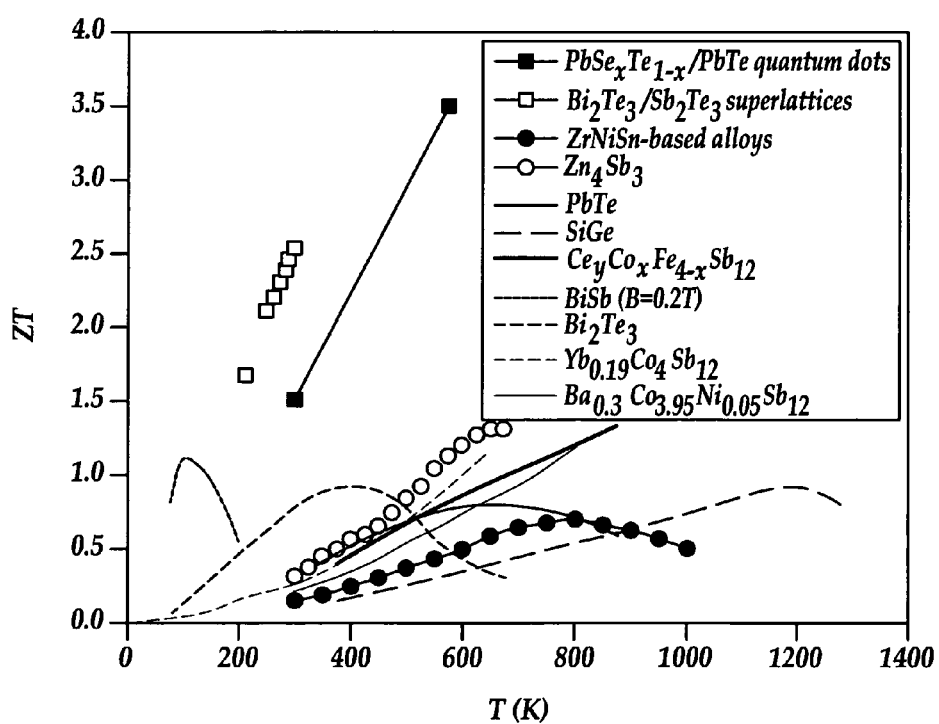
FIG. 2 is a graphical representation depicting temperature dependence of ZT for various state-of-the-art thermoelectric materials.

FIG. 2 is a comparison graph depicting the temperature dependence of the figure of merit (ZT) for previously known TE materials: BiSb, $Bi_2Te_3$, PbTe, and SiGe. FIG. 2 also depicts the temperature dependence of the figure of merit (ZT) for $Bi_2Te_3/Sb_2Te_3$ superlattices, $PbSe_{1-x}Te_x/PbTe$ quantum dots, $Ce_yCo_xFe_{4-x}Sb_{12}$ (Ce-filled skutterudites), $Yb_{0.19}Co_4Sb_{12}$ (Yb-filled skutterudites), $Ba_{0.3}Co_{3.95}Ni_{0.05}Sb_{12}$ (Ba-filled skutterudites), and ZrNiSn-based half-Heusler alloys.

It is believed that the nanocomposite material(s) 10 as defined herein are advantageously able to withstand high temperature applications, for example, applications at temperatures ranging from about 800K to about 1300K. It is further believed that the nanocomposite material(s) 10 as defined herein are advantageously able to withstand lower temperature applications, for example, applications at temperatures ranging between from about 300K to about 800K. As such, it is believed that the nanocomposite materials 10 as disclosed herein may be suitable for use in conjunction with automotive exhaust systems, which typically exhibit temperatures around about 800K under normal running conditions.

Figure 3:
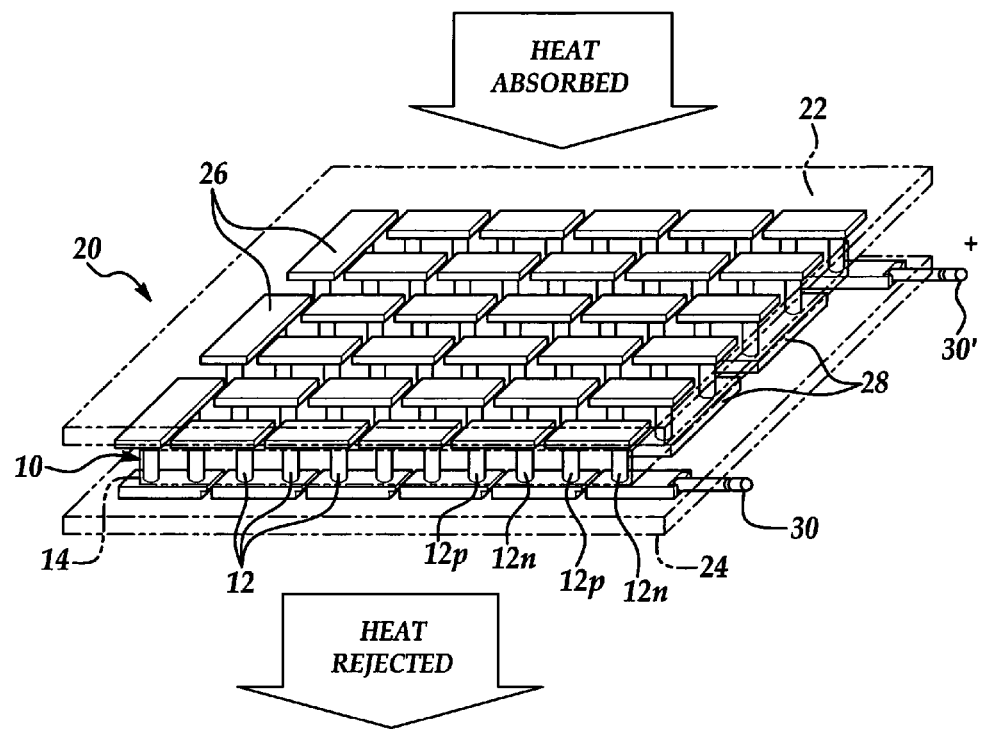
FIG. 3 is an enlarged, semi-schematic perspective view of an embodiment of a thermoelectric device.

Referring now to FIG. 3, a thermoelectric device 20 is shown. The device 20 includes opposed substrates 22, 24 having disposed thereon/therein two opposed sets 26, 28 (respectively) of electrical interconnect members (each set 26, 28 is shown having a plurality of electrical interconnect members, though it is to be understood that each set 26, 28 may have one or more electrical interconnect members) having the nanocomposite material 10 operatively disposed therebetween. External electrical connections 30, 30' are operatively connected to at least one of the opposed sets 26, 28 of electrical interconnect members. As shown in FIG. 3, the negative and positive electrical connections 30, 30', respectively, are operatively connected to the lower electrical interconnect member 28.

The nanowires 12 may, in some instances, be alternately arranged as p-type semiconductor materials 12p and n-type semiconductor materials 12n, as shown in FIG. 3. For clarity, only a few nanowires 12p and 12n are referred to, though it is to be understood that the pattern may continue across the remainder of the row and up the columns.

The present disclosure advantageously tailors a two-phase architecture, with one emphasis on designing and building nanostructures that substantially optimize the results of competing forces, non-limitative examples of which include electrical properties and thermal transport properties. Further, although some examples of ZT values are given herein, it is to be understood that any high ZT materials may be used in the composite structures 10 of the present disclosure that are advantageously suitable for high temperature applications. The combination of porous materials having the desired properties as stated hereinabove (e.g. low thermal conductivity, low thermal expansion coefficient, and/or the like), along with nanowires 12 formed from high ZT materials, forms the nanocomposite material(s) 10 for use in many applications, one non-limitative example of which is high temperature waste heat recovery.

While several embodiments have been described in detail, it will be apparent to those skilled in the art that the disclosed embodiments may be modified. Therefore, the foregoing description is to be considered exemplary rather than limiting.

The invention claimed is:

1. A thermoelectric device, comprising:
a nanocomposite material, including nanowires of at least one thermoelectric material having a predetermined figure of merit, the nanowires being formed in a porous substrate having a low thermal conductivity and having an average pore diameter that is greater than about 15 nm, but no larger than about 300 nm, and the nanowires being formed from a thermoelectric material selected from the group consisting of $PbSe_xTe_{1-x}/PbTe$ quantum dots, $Zn_4Sb_3$-based alloys, and ZrNiSn-based half-Heusler alloys.

2. The thermoelectric device as defined in claim 1 wherein the low thermal conductivity is equal to or less than about 2 W/m-K at room temperature.

3. The thermoelectric device as defined in claim 1, further comprising:
two opposed sets of electrical interconnect members having the nanocomposite material operatively disposed therebetween; and
external electrical connections operatively connected to at least one of the opposed sets of electrical interconnect members.

4. The thermoelectric device as defined in claim 3 wherein the nanowires are alternately p-type semiconductor materials and n-type semiconductor materials, respectively.

5. The thermoelectric device as defined in claim 3, further comprising two opposed substrates having the two opposed sets of electrical interconnect members and the nanocomposite material operatively disposed therebetween.

6. The thermoelectric device as defined in claim 1 wherein the predetermined figure of merit is greater than about 1 at temperatures ranging from about 300 K to about 900 K.

7. The thermoelectric device as defined in claim 1 wherein the porous substrate is a controlled pore glass.

8. A nanocomposite material, comprising:
a porous substrate having a low thermal conductivity and having an average pore diameter ranging from about 4 nm to about 300 nm; and
nanowires formed in the porous substrate, the nanowires formed of at least one thermoelectric material having a predetermined figure of merit, the at least one thermoelectric material being selected from the group consisting of $PbSe_xTe_{1-x}/PbTe$ quantum dots, $Zn_4Sb_3$-based alloys, and ZrNiSn-based half-Heusler alloys.

9. The nanocomposite material as defined in claim 8 wherein the nanowires are formed in the porous substrate via a process selected from vapor deposition, electrochemical deposition, and combinations thereof.

10. The nanocomposite material as defined in claim 8 wherein the low thermal conductivity is equal to or less than about 2 W/m-K at room temperature.

11. The nanocomposite material as defined in claim 8 wherein the average pore diameter is greater than about 15 nm.

12. The nanocomposite material as defined in claim 8 wherein the nanocomposite material is adapted to be operatively disposed between two opposed sets of electrical interconnect members.

13. The thermoelectric device as defined in claim 8 wherein the nanowires are alternately p-type semiconductor materials and n-type semiconductor materials, respectively.

14. The thermoelectric device as defined in claim 8 wherein the porous substrate is a controlled pore glass.

15. The thermoelectric device as defined in claim 8 wherein the predetermined figure of merit is greater than about 1 at temperatures ranging from about 300 K to about 900 K.

16. A thermoelectric device, comprising:
two opposed substrates;
two opposed sets of electrical interconnect members, one of the two opposed sets positioned adjacent one of the two opposed substrates and an other of the two opposed sets positioned adjacent an other of the two opposed substrates; and
a nanocomposite material operatively disposed between the two opposed sets of electrical interconnect members, wherein the nanocomposite material includes:
a porous substrate having a low thermal conductivity and having an average pore diameter ranging between about 4 nm and about 300 nm; and
nanowires of at least one thermoelectric material having a predetermined figure of merit formed in the porous substrate, the at least one thermoelectric material being selected from the group consisting of $PbSe_xTe_{1-x}/PbTe$ quantum dots, $Zn_4Sb_3$-based alloys, and ZrNiSn-based half-Heusler alloys.

17. The thermoelectric device as defined in claim 16, further comprising external electrical connections operatively connected to at least one of the opposed sets of electrical interconnect members.

18. The thermoelectric device as defined in claim 16 wherein the porous substrate has an average pore diameter ranging from about 25 nm to about 150 nm.

19. A nanocomposite material, comprising:
a porous substrate having a low thermal conductivity and having an average pore diameter ranging from about 4 nm to about 300 nm; and
nanowires formed in the porous substrate, the nanowires formed of at least one thermoelectric material having a predetermined figure of merit, the at least one thermoelectric material being selected from the group consisting of $PbSe_xTe_{1-x}/PbTe$ quantum dots and ZrNiSn-based half-Heusler alloys.

* * * * *